United States Patent [19]
Borkar et al.

[11] Patent Number: 6,067,232
[45] Date of Patent: *May 23, 2000

[54] SYSTEM FOR CONNECTING SUBSYSTEMS OF DISSIMILAR THERMAL PROPERTIES

[75] Inventors: Shekhar Yeshwant Borkar, Portland, Oreg.; Robert Scott Dreyer, Palo Alto; Hans Mulder, San Francisco, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/777,260

[22] Filed: Dec. 31, 1996

[51] Int. Cl.[7] ....................................................... H05K 7/20
[52] U.S. Cl. ............................ 361/705; 361/695; 361/753
[58] Field of Search ........................ 439/55, 485, 65–68, 439/76.1, 77; 165/80.3, 185; 174/16.3, 252; 257/706, 707, 713, 722–724; 361/687, 690, 694, 695, 697, 703–707, 709–712, 717–719, 722, 736, 752, 753, 789

[56] References Cited

U.S. PATENT DOCUMENTS

| | | | |
|---|---|---|---|
| 4,825,337 | 4/1989 | Karpman | 361/716 |
| 5,272,593 | 12/1993 | Jacob | 361/707 |
| 5,327,324 | 7/1994 | Roth | 361/707 |
| 5,339,214 | 8/1994 | Nelson | 361/695 |
| 5,461,540 | 10/1995 | Lee | 361/687 |
| 5,570,270 | 10/1996 | Naedel | 361/704 |
| 5,706,171 | 1/1998 | Edwards | 361/719 |
| 5,712,762 | 1/1998 | Webb | 361/687 |

FOREIGN PATENT DOCUMENTS

| | | | |
|---|---|---|---|
| 412115 | 11/1966 | Switzerland | 361/707 |

*Primary Examiner*—Gerald Tolin
*Attorney, Agent, or Firm*—Blakely, Sokoloff, Taylor & Zafman LLP

[57] ABSTRACT

A system which includes a chassis having a first side and a second side; a circuit board having a set of components, the first circuit board mounted on the first side of the chassis; an integrated circuit package mounted on the second side of the chassis; and a set of electrical connections providing a communications network between the circuit board and the integrated circuit package; wherein the integrated circuit package is thermally coupled to the second side of the chassis.

10 Claims, 8 Drawing Sheets

SYSTEM FOR CONNECTING SUBSYSTEMS OF DISSIMILAR THERMAL PROPERTIES

RELATED APPLICATIONS

The present application is related to the following patent and co-pending applications: U.S. patent entitled "Daisy Chained Clock Distribution Scheme," by Borkar, et al., U.S. Pat. No. 5,546,023, issued Aug. 13, 1996 and filed Jun. 26, 1995; U.S. patent Application entitled "Point-To-Point Phase-Tolerant Communication," by Self et al., application Ser. No. 08/296,019, now U.S. Pat. No. 5,623,644, filed Aug. 25, 1994; U.S. patent Application entitled "Microprocessor Point-To-Point Communication," by Self et al., application Ser. No. 08/295,556, now U.S. Pat. No. 5,634,043, filed Aug. 25, 1994; U.S. Application entitled "Power-Pod Power Delivery System," by McCutchan et al., application Ser. No. 08/672,864, now U.S. Pat. No. 5,864,478, filed on Jun. 28, 1996; U.S. patent Application entitled "Method and Apparatus for Mounting a Very Large Scale Integration (VLSI) Chip Package to a Computer Chassis for Cooling," by Borkar et al., application Ser. No. 08/777,601, now abandoned, filed Dec. 31, 1996; U.S. patent Application entitled "Method and Apparatus for Retrofit Mounting a VLSI Chip to a Computer Chassis for Cooling," by Borkar et al., Application No. 08/777,251, filed Dec. 31, 1996; U.S. patent Application entitled "Method and Apparatus for Mounting a Very Large Scale Integration (VLSI) Chip Package to a Computer Chassis for Current Supply," by Borkar et al., Application No. 08/777,604, now U.S. Pat. No. 5,978,228, filed Dec. 31, 1996; U.S. patent Application entitled "Method and Apparatus for Retrofit Mounting a VLSI Chip to a Computer Chassis for Current Supply," by Borkar et al., Application Ser. No. 08/775,784, filed Dec. 31, 1996; and U.S. patent Application entitled "Method and Apparatus for Mounting a Power Supply to a Computer Chassis for Cooling," by Borkar et al., application Ser. No. 08/775,782, filed Dec. 31, 1996, now abandoned.

FIELD OF THE INVENTION

The present invention generally relates to the connection of subsystems in a computer system. More particularly, the present invention relates to the use of point-to-point communications to connect subsystems with dissimilar thermal properties.

BACKGROUND OF THE INVENTION

A Very Large Scale Integration (VLSI) chip is generally composed of a silicon die having an integrated circuit printed thereon, a package for housing the silicon die which can be made of ceramic, organic or other types of chip carrier packages, and various types of electronic connection to the silicon die that extends to the exterior of the package for connection in an electronic system. Transistors and other circuit components reside on the silicon die and require power and signal connection extending to the exterior of the package. These connections would typically be coupled to a printed circuit board for further integration with other electronic components which are also located on the printed circuit board.

Figure 1:
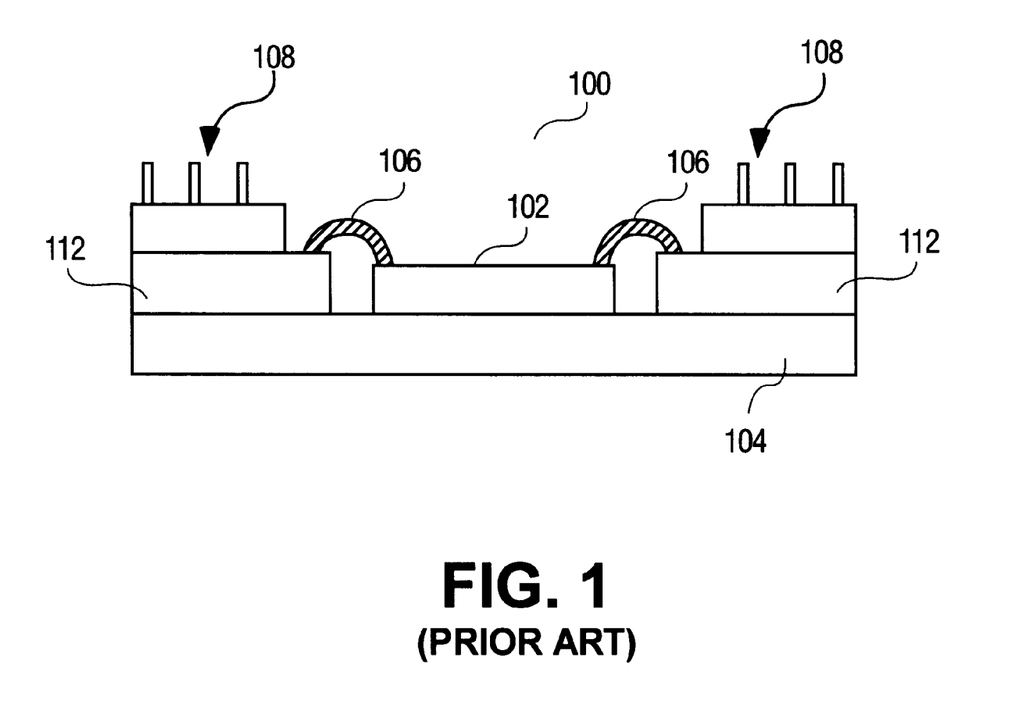
FIG. 1 illustrates a side view of a prior art VLSI chip package.

Referring to FIG. 1, one configuration of a conventional package 100 is shown. VLSI 102 is shown mounted on a ceramic base 104 and is connected via bond wires 106 to connection pins 108 through pin circuitry 112 of chip package 100. Ceramic base 104 is coupled to chip package 100 to dissipate heat from VLSI 102 out to the ambient environment outside chip package 100. Connection pins 108 are configured to mount on a circuit board (not shown) for further connection to other components.

As processing methods improve and designs become more advanced, every generation of VLSI chips continues to grow in complexity, performance and power consumption. As a result, the power and current demands for every generation of VLSI chips also increase. One of the biggest challenges for future generations of VLSI chips is managing the chip's power consumption.

Figure 2:
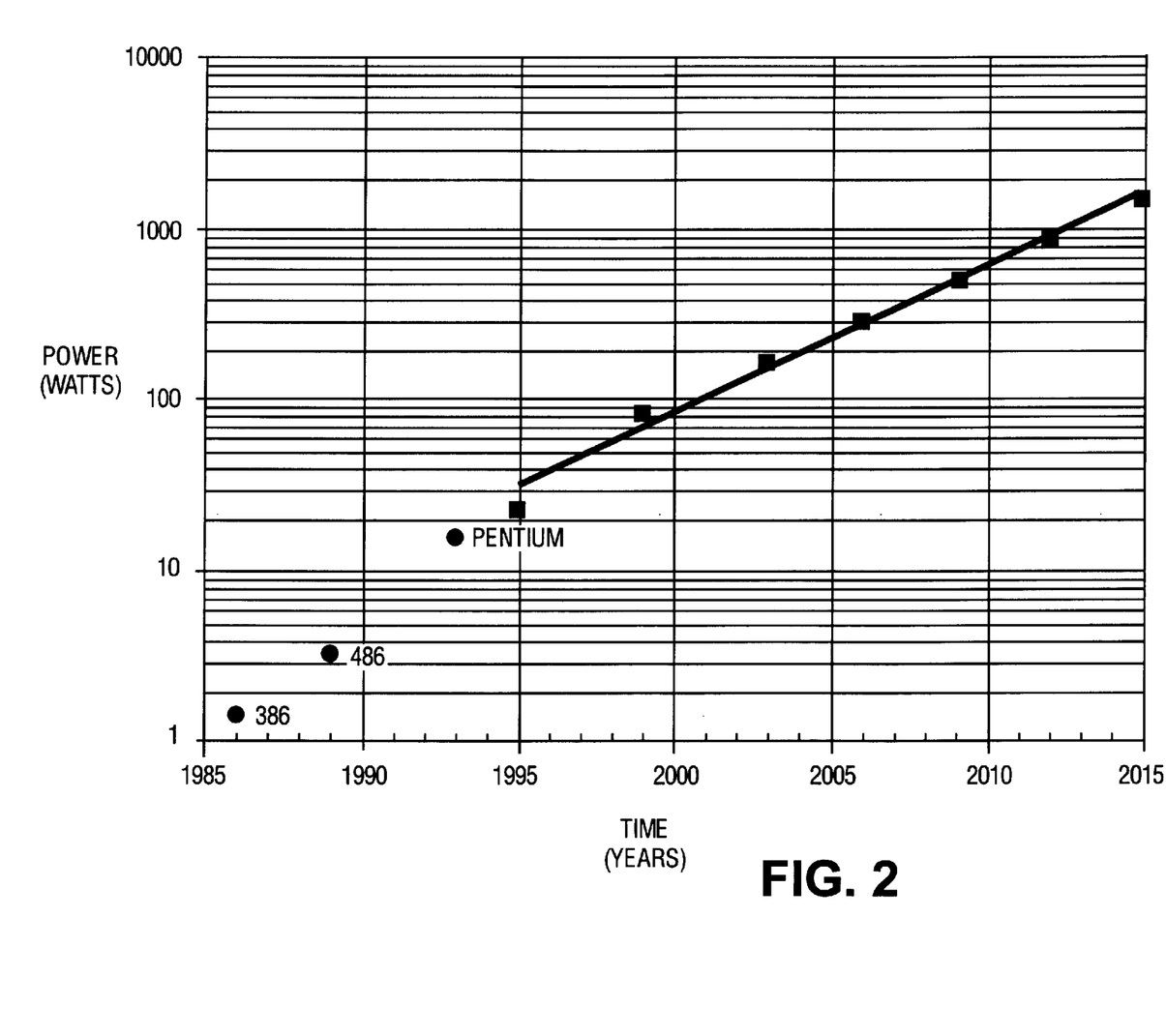
FIG. 2 is a logarithmic graph illustrating past, present and predicted power demands of microprocessors.

AS shown in FIG. 2, the power consumption of a typical microprocessor is between 1 and 10 watts. However, as more complicated microprocessors are developed, more transistors are used, the size of the silicon die grows and the signal frequency greatly increases. Thus, as new generations of microprocessors are developed, however, the power demands are expected to increase into the hundreds or even thousands of watts as the complexity of the chip increases and as better chip performance is demanded.

One modern solution to manage increased power demand is voltage scaling. Voltage scaling is the process of reducing the voltage level of signals transmitted in VLSI chips so that less power is demanded. Power has a quadratic relationship to voltage where power is proportional to the square of the voltage. Hence, if the supply voltage is reduced by half, the power is reduced by one-fourth, giving a dramatic decrease in the power demand.

For example, in the 1980's, the typical power supply voltage was 5 volts. Later in the 1990's, the average supply voltage was reduced to 3.3 volts. More modern designs have reduced the supply voltage to as low as 2.5 volts and even 1.8 volts. Voltage scaling, however, has its limits and the continuing increase in power demands are still inevitable.

Figure 3:
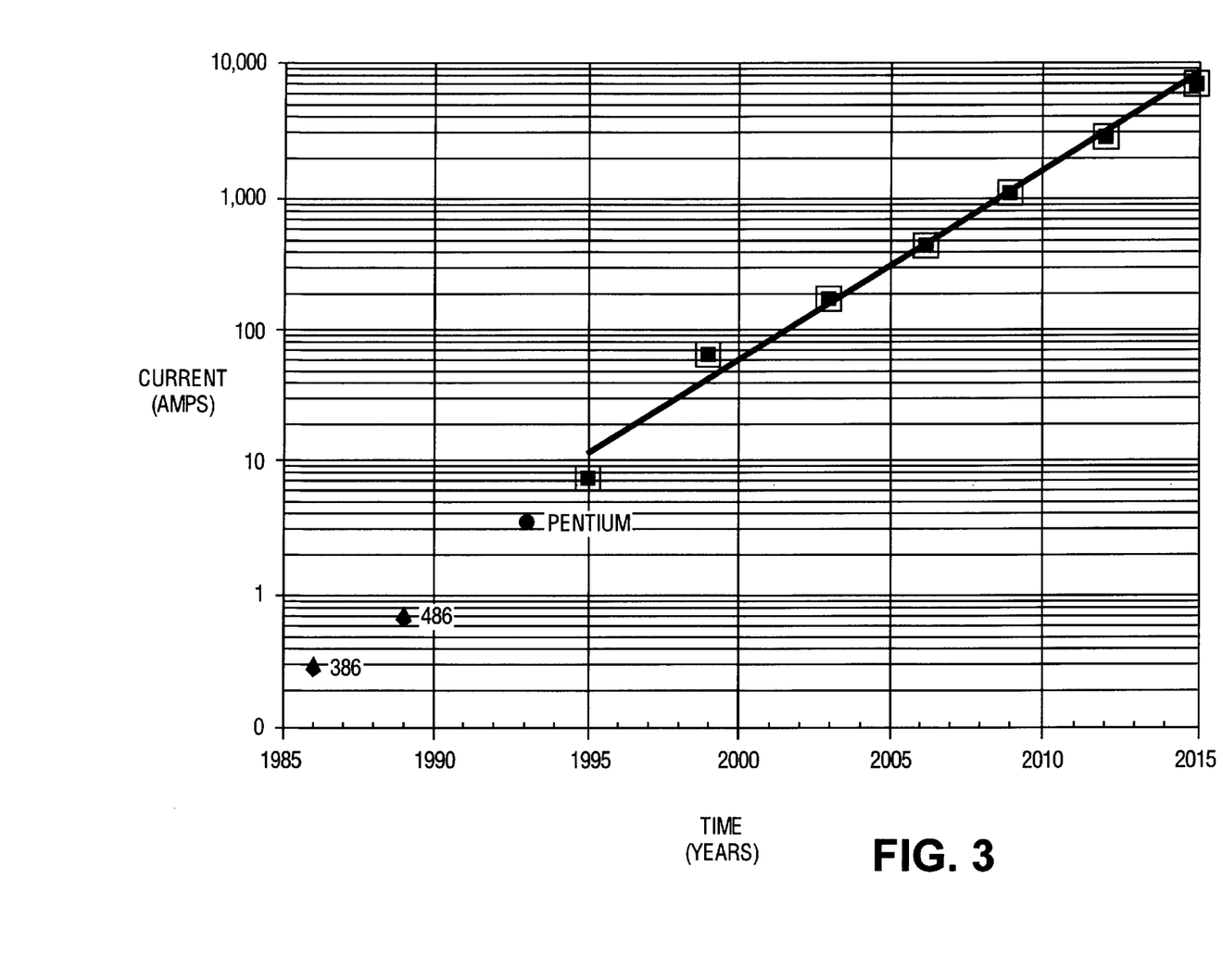
FIG. 3 is a logarithmic graph illustrating past, present and predicted current demands of microprocessors.

Unlike power, current is linearly proportional to voltage, according to Ohm's Law (V=IR). Therefore, if the supply voltage is reduced by half, the current is also reduced by half. Hence, voltage scaling only reduces supply currents by the same rate as reduction in voltage. Referring to FIG. 3, a logarithmic graph selected of microprocessor current demands over time is shown. For example, the Intel Corporation 80386 microprocessor had a current demand of less than 0.2 amperes. In 1989, the Intel 80486 microprocessor had twice the demand of the 80386 microprocessor of 0.4 amperes. Still further, the Pentium™ processor, available in 1993, had a much higher power demand of around 3 amperes. At this rate, according to the projected graph of FIG. 3, as time goes on, the current demand for microprocessors will greatly increase into the hundreds and even thousands of amperes. The net effect is that the power and current demands are, and will continue to be, major concerns in chip design.

With ever increasing power demands in next generation microprocessors and other VLSI's, heat dissipation is becoming another design concern. This concern is especially important with the emphasis of new designs moving towards multi-processor configurations.

Figure 4:
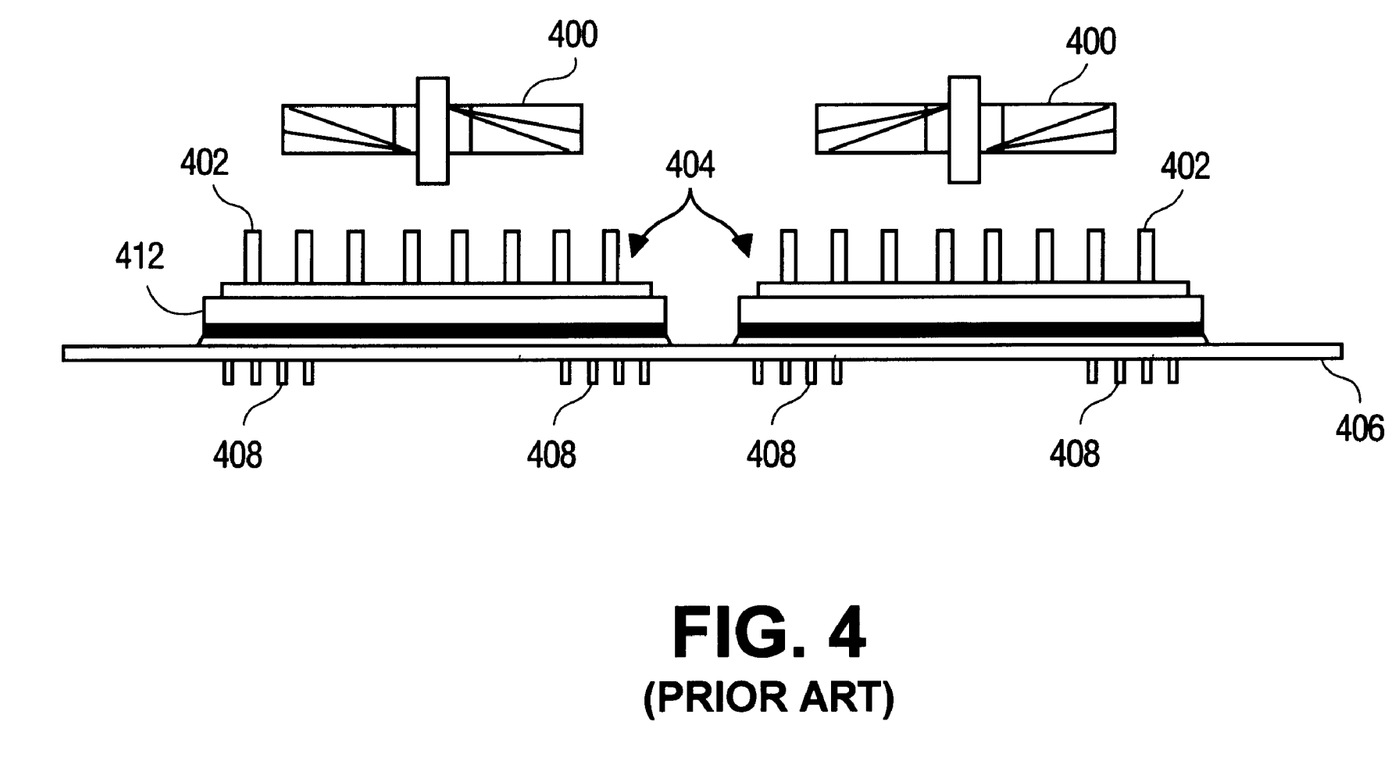
FIG. 4 illustrates a set of VLSI chip packages as they might be mounted in a computer system of the prior art.

FIG. 4 illustrates a conventional solution to power dissipation in a set of VLSI chip packages 404. Each overall package 404 is similar to that of FIG. 1 with the addition of cooling fins 402 mounted on base 412. The base 412 is typically made up of a material which allows for rapid heat dissipation such as ceramic or an organic or conductive material to help dissipate the heat through cooling fins 402. Set of VLSI chip packages 404 generates heat which is transferred to the base 412 for ultimate dissipation through the cooling fins 402. Each of set of VLSI chip packages 404 is typically mounted to a mother board 406 via set of pins 408.

Cooling fins 402 are usually exposed to the ambient temperature within a system such a computer chassis that may further provide fans and other cooling means to help dissipate the heat generated by the components in the system. For example, a modern more aggressive cooling technique is illustrated in FIG. 4 where a set of cooling fans 400 are located closely to a set of cooling fins 402 which are mounted on a respective ones of set of VLSI. As mentioned above, set of VLSI chip packages 404 are mounted to the mother board 406 via set of pins 408 for interconnection to the rest of the system (not shown). Set of cooling fins 402 is capable of dissipating a large amount of heat from set of VLSI chip packages 404.

As the rate of cooling is directly proportional to the difference in temperature, since the inside of a typical computer case is warm as a result of the heat generated by the collective components in the computer case, it will be useful to somehow expose set of VLSI chip packages to lower ambient temperature for more efficient heat dissipation.

One technique that has been used in the entertainment electronics industry for dissipating the heat generated from high power transistors has been to mount these transistors on the backside or other surface of a chassis. The surface on which the transistors are mounted is exposed to the ambient temperature outside of the chassis and, therefore, is able to dissipate heat from the heat generating transistors to the lower temperature of the outside environment.

However, to apply the technique of moving devices which are the heat generating culprits, such as microprocessors and other VLSI chips, away from their proximity to the other components on the main circuit board and place them on the surface of a chassis in order for cooling purposes could greatly degrade their performance in the system. As explained below, this is due to the use of a shared bus architecture in current computer systems.

Figure 5:
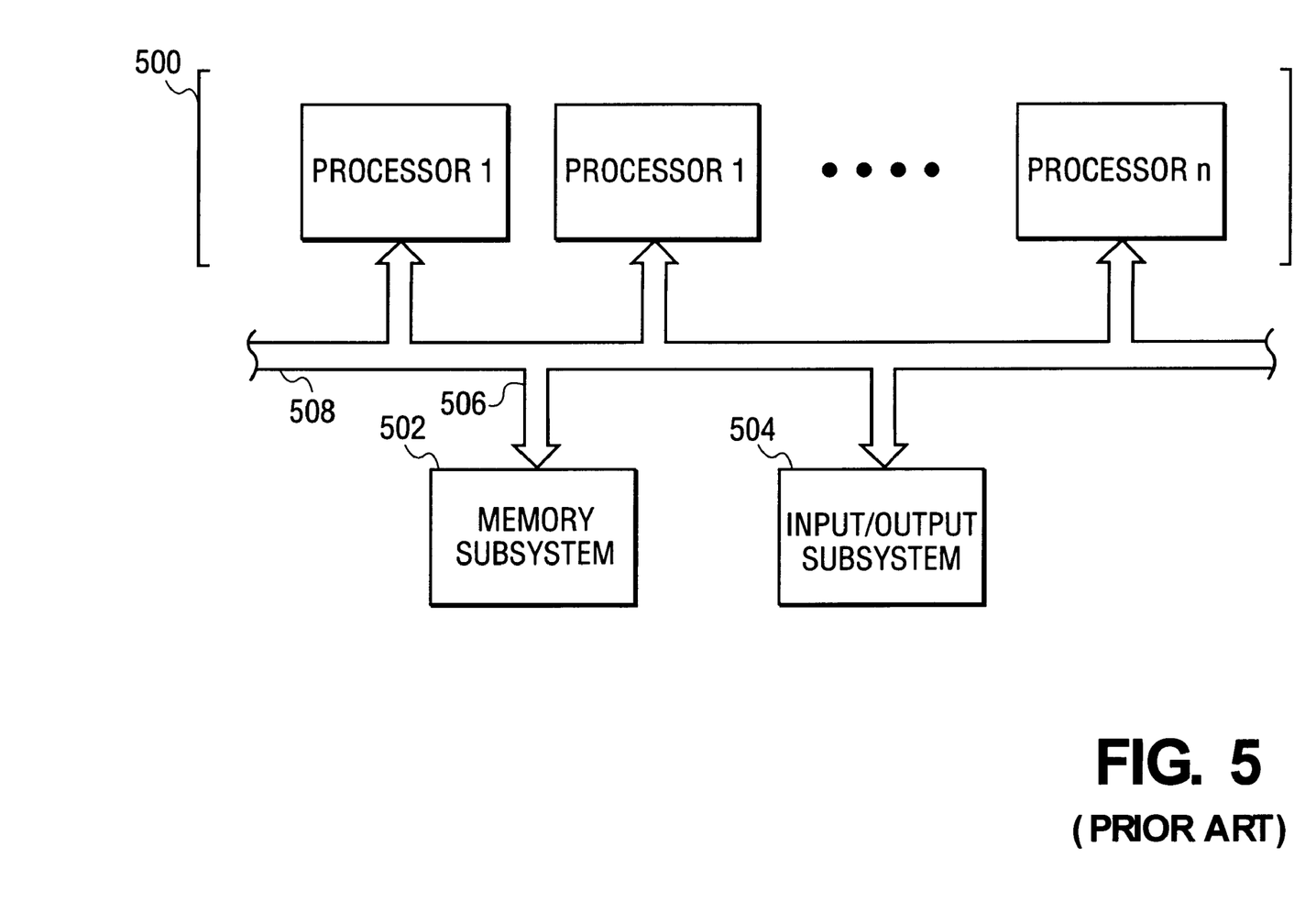
FIG. 5 is a block representation of the prior art interconnections of components in a computer system with a stubbed bus system.

Conventional computer systems connect components through a bus network that provides communication among subsystems such as a set of processors, memory sub-systems, input/output sub-systems and other sub-systems. Conventional methods call for mounting the microprocessor (s) on a motherboard, which is in the close proximity of the memory and peripheral components. Hence the microprocessor bus is short, thus fast. FIG. 5 is a general block diagram of such a prior art configuration where a set of microprocessors 500 are connected to a memory sub-system 502 and an input/output sub-system 504 via a set of connection stubs 506 on a system bus 508. System bus 508 is also known as a "stubbed bus".

In this configuration, set of connection bus stubs 506 allow each agent on system bus 508 (e.g., components such as set of micro-processors 500, memory sub-system 502, and input/output sub-system 504), to drive system bus 508 with a signal which is broadcasted to all of the agents sharing system bus 508. Every signal is broadcasted to all agents, but only the agent waiting for the appropriate signal responds to the signal.

Performance of the above configuration is greatly limited since system bus 508 is at risk of being overloaded when the agents connected to it become demanding, greatly degrading the performance. In addition, while operating frequencies of microprocessors have increased, the operating speeds of shared system buses have not increased to a significant amount. This is due to the difficulties in ensuring that the timing, impedance and other characteristics of the shared system bus remain within certain parameters.

In stubbed bus systems, short trace lengths between components must be maintained to ensure reliability and signal integrity. Thus, all sub-systems are generally placed in close proximity to achieve short trace lengths between the components of the stubbed bus. Thus, for a stubbed system bus, to try and separate components to any length is a difficult and expensive proposition.

The above restrictions of current shared system buses does not allow a designer to move heat generating components such as processors and other VLSI chips from a circuit board located inside a case to a surface on the case itself. In addition, when subsystems are placed on different surfaces, the subsystems will be operating with different ambient temperatures, as the subsystems which are located towards the center of the case will be at a different, most likely higher, temperature.

Thus, without being able to bypass the problems which would be presented by using a shared system bus if certain bus components were to be moved from the main circuit board to be mounted on a surface of a case, no benefit of the dissipation of heat through the use of the larger surface area of the case would be possible.

SUMMARY OF THE INVENTION

In order to allow designers to relocate various subsystems anywhere inside a computer case, a set of flexible cable interconnects along with a point-to-point communications protocol is provided. Thus, communications between one or more very large scale integration (VLSI) chips located on the casing of a computer chassis with other subsystems located on a circuit board can be achieved.

Thus, a system includes a chassis having a first side and a second side; a circuit board having a set of components, the first circuit board mounted on the first side of the chassis; an integrated circuit package mounted on the second side of the chassis; and a set of electrical connections providing a communications network between the circuit board and the integrated circuit package; wherein the integrated circuit package is thermally coupled to the second side of the chassis.

The flexible interconnect cable can be a flexible interconnection fabric (such as a ribbon cable). The flexibility in the interconnection fabric helps avoid stresses involved due to dissimilar coefficients of thermal expansions. The flexible interconnection sceheme would allow the use of a different interconnection scheme than the use of specialized circuit boards.

A preferred embodiment of the present invention allows the connection of a set of VLSI chips, such as a set of microprocessors, which is located on the back-chassis of the computer system, among themselves, and to other components on a motherboard.

The use of the point-to-point communications protocol removes the impedance and signal degradation limitations suffered by a shared bus system and allows the physical separation of sub-systems while the set of flexible cable interconnects helps solve the problems caused by the different temperatures which exist in separated sub-systems. Flexible interconnects is a way to connect the subsystems which require point-to-point communications. The point-to-point communication scheme overcomes the following limitations of the stubbed bus: (1) low performance due to signal degradation; (2) wide datapath necessary to provide the needed bandwidth; and (3) limited in length to maintain signal integrity. Point-to-point buses implemented using a flexible interconnect solve all these problems.

DETAILED DESCRIPTION

The present invention uses flexible interconnects and point-to-point communication protocol to connect subsystems of dissimilar thermal properties. In this detailed description, one embodiment of a VLSI chip package is described showing interconnections to a computer system. It should be understood that this embodiment is for the purpose of illustration and is not provided as a limitation in that the present invention may be practiced on other VLSI chip packages where it is desirable to utilize mounting on a chassis of a computer system or other enclosures.

Throughout this detailed description, numerous specific details are set forth regarding VLSI component interconnections, cooling devices, VLSI microprocessors, memory subsystems and various other subsystems to provide a thorough understanding of the present invention. It will be appreciated by one skilled in the art that the present invention may be practiced without such specific details. In other instances, well known components, structures and techniques have not been described in detail in order to avoid obscuring the subject matter of the present invention.

Also, a VLSI chip package as described herein can include a microprocessor and micro-controller as well as many other types of circuits that are produced and sold in packages configured for integration into electrical circuits in which they interact. The present invention is in no way limited to any particular type of VLSI chip package, any type of package or any type of circuit in which a package may be integrated. Furthermore, the mechanical configurations described can take on many forms when custom made to conform to a particular system for mounting and electrical connection. The forms described in the text and illustrated in the drawings are intended for illustration purposes only and are in no way intended to limit the scope of the invention.

Reference will be made to a computer chassis wherein various configurations of the present invention are employed. The use of a computer system is intended only for illustrative purposes and is not intended to limit the present invention to the environment of a computer system. A VLSI chip package such as a microprocessor chip package can be mounted described below on a computer chassis or a desktop computer system, a notebook or laptop computer, or many other types of personal computer systems. Furthermore, the present invention can be employed in mounting many other types of VLSI chips including microprocessors on other types of system framework that could provide a heat dissipation source or a current supply as described below. Therefore, it is not intended to limit the present invention to the environment of any particular type of system or apparatus. Therefore, reference is made to the claims set forth below that set forth the true spirit and scope of the invention.

Figure 6:
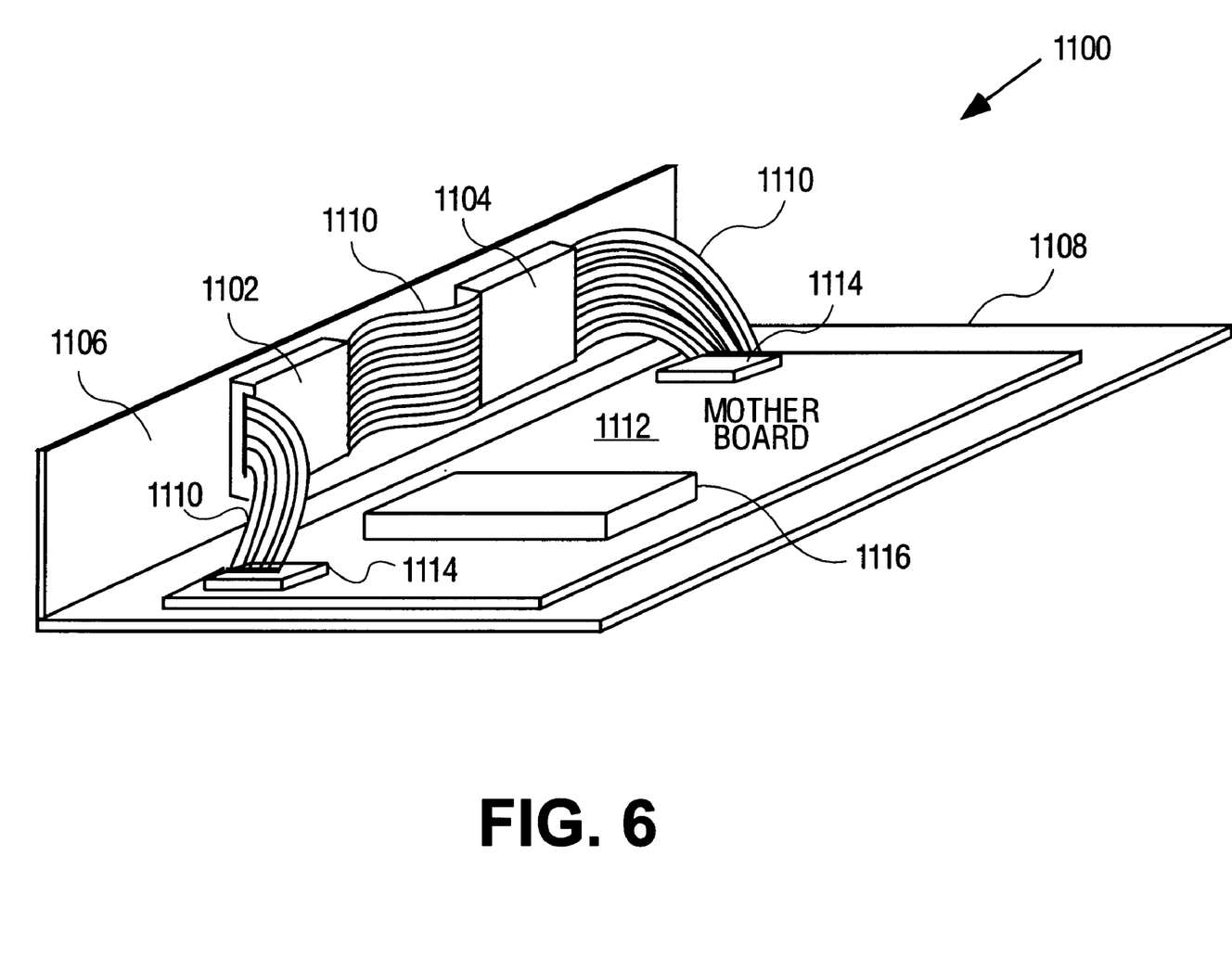
FIG. 6 is a perspective view of a point-to-point interconnect configuration in accordance with one embodiment of the present invention.

FIG. 6 illustrates a perspective view of an interconnection circuit 1100 which is configured in accordance with a preferred embodiment of the present invention. A first VLSI chip package 1102 and a second VLSI chip package 1104 are shown mounted on a back surface 1106 of a computer chassis 1108. Interconnect circuit 1100 includes a set of interconnect bus lines 1110 for connecting first VLSI chip package 1102 and second VLSI chip package 1104 to a set of computer components 1116 on a motherboard 1112 through the use of a set of connectors 1114.

In the preferred embodiment, first VLSI chip package 1102 and second VLSI chip package 1104 are mounted on back surface 1106 of computer chassis 1108 to achieve direct thermal contact with the ambient environment surrounding computer chassis 1108. In an alternate embodiment, another surface of computer chassis 1108 (not shown) can be used. Thus, first VLSI chip package 1102 and second VLSI chip package 1104 can also be mounted on a top surface of computer chassis 1108 (not shown) to allow heat dissipation through the top surface. Moreover, as described below, heat dissipation devices such as heat sinks or fans can be used to increase the speed at which the heat generated by first VLSI chip package 1102 and second VLSI chip package 1104 is tranferred to the outside environment.

Set of interconnect bus lines 1110 is used for transmitting information between first VLSI chip package 1102, second VLSI chip package 1104, and set of computer components 1116. As will be discussed below, a point-to-point communication protocol is used to transmit information between each component. A point-to-point communication scheme consists of one signal driver and only one receiver at the end, unlike a regular stubbed bus which has one driver and several receivers at different points.

Since the bus is point to point, the agent does not have to arbitrate for its use. However, the transaction occuring on this private bus between the processor and the nearby agent is not visible to the other agents. This transaction needs to be explicitly forwarded by the agents successively until it is complete. Hence the agents have to be connected together using these point-to-point communication protocols in a closed loop. The simplest topology is a ring, as is shown in FIG. 6.

The protocol related to such communication includes well known protocols in the art such as those discussed in U.S. patent Application "Microprocessor Point-To-Point Communication" of Self et al., "Point-To-Point Phase-Tolerant Communication" of Self et al., and U.S. Pat. No. 5,546,023 of Borkar et al. Such a configuration provides signal transmission integrity between first VLSI chip package 1102, second VLSI chip package 1104 and motherboard 1112 via connection 1114 to provide communication to the computer components 1116 monitored on the motherboard 1112.

Figure 7:
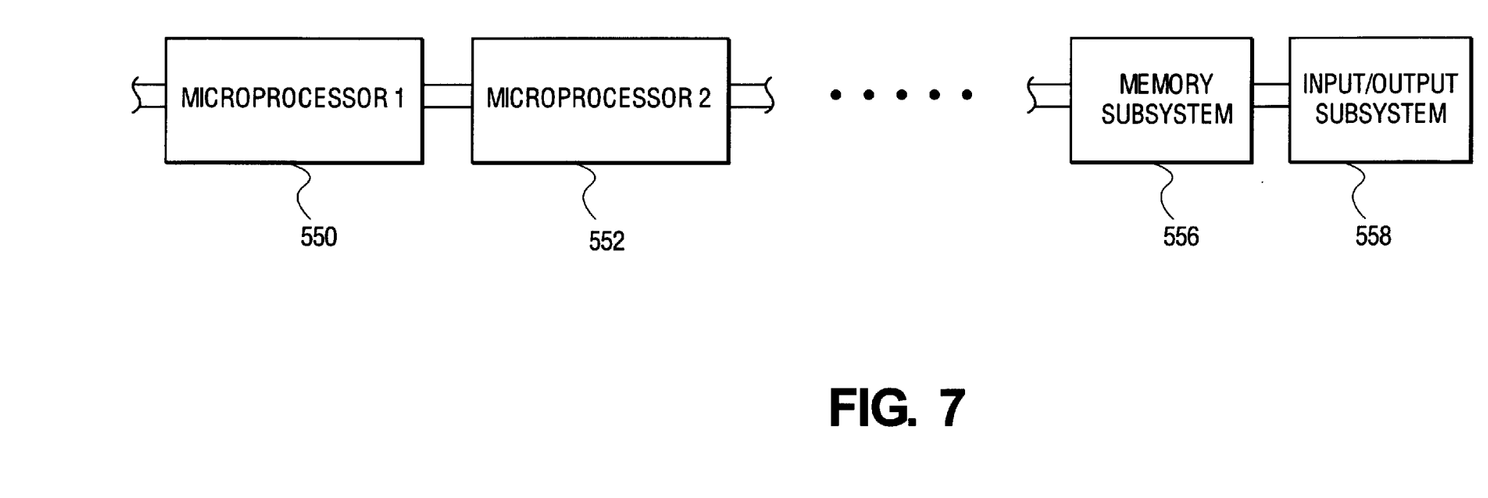
FIG. 7 is a block representation of interconnections of components in a preferred embodiment of a computer system with a point-to-point communication system.

Referring now to FIG. 7, an exemplary configuration of computer components in a point-to-point network is illustrated. A set of microprocessors 550 and 552 are shown connected in series along with a memory system 556 and an input/output subsystem 558. Although not specifically shown, additional subsystems and/or microprocessors can be placed in series, as indicated by the ellipsis in FIG. 7.

The configuration contained in FIG. 7 typically requires a point-to-point interconnection in order for the components to communicate and to transfer information throughout the system. Many advantages are realized by such a configuration. Most importantly, the hand-shaking or point-to-point interconnect provides a mechanism to produce consistent signals with low degradation.

Since the point-to-point signalling has only one receiver, the signal integrity is maintained at the receiver, which allows the bus to run the signalling at very high speeds. This is typically orders of magnitude higher than the stubbed bus. In case of the stubbed bus, each receiver stub acts as a partial termination, often creating unnecessary reflections of the signal and affecting the signal itegrity.

The bus may be implemented using uni-directional or bi-directional signalling technology. For implementation using the uni-directional technology, the output of the bus is constructed in the same manner as any output of the microprocessor. However, the output impedance of the output driver must be matched to the impedance of the trace. For example, if the trace carrying the signal is 50 ohms, then the output impedance of the driver must be set to be 50 ohms. This impedance matching terminates the signal better, resulting in better performance of the point-to-point signal transmission. The construction and adjustment of the output drivers of microprocessors is well understood.

At times, multiple transistors are used in parallel, enabled selectively, to control the impedance of the output driver. At the other end of the point-to-point bus is a receiver which is similar to the traditional receiver built on a microprocessor. The signal may be terminated at the receiver using a resistor, if the signalling scheme is of the parallel termination type. All these techniques are well known.

Since point-to-point buses operate at very high frequency, they yield very high bandwidth; often more than what is needed. Hence the protocol allows the width of the buses to be narrowed to save cost. For example, a typical microprocessor bus which is 64 bits wide and running at 100 Mhz yields 800 Mbytes/sec bus bandwidth. A point-to-point bus could run at 800 Mhz, requiring only about an 8 bit wide bus.

Figure 8:
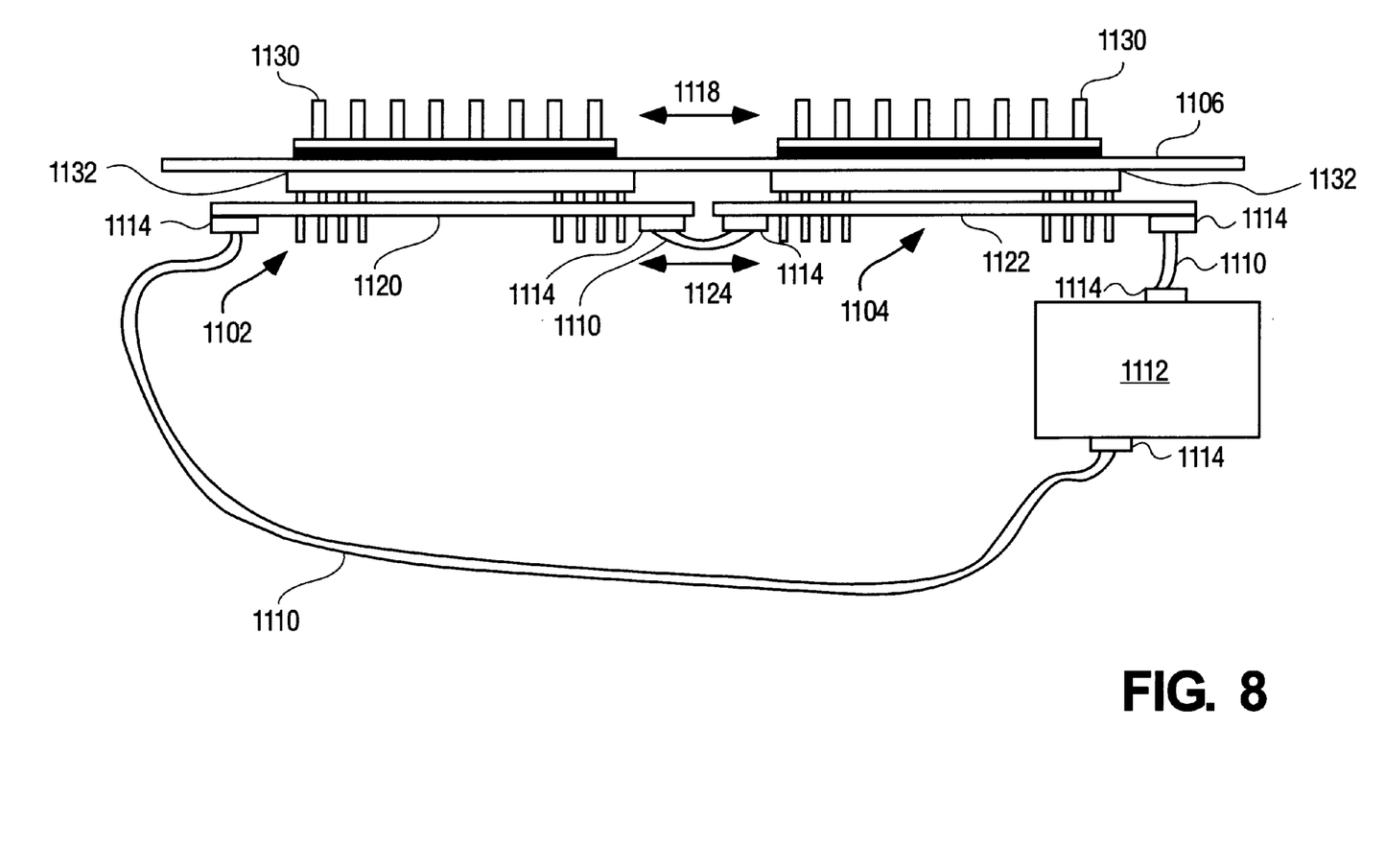
FIG. 8 is a top view of a pair of VLSI chip packages mounted on a computer chassis and communicating through a flexible interconnect in accordance with one embodiment of the present invention.

Referring now to FIG. 8, a top view of back surface 1106 is shown. Connection lines 1110 are flexible data communication lines that are able to move with the movement of first VLSI chip package 1102 and second VLSI chip package 1104. Connection lines 1110 also allow the placement of first VLSI chip package 1102 and second VLSI chip package 1104 on back surface 1106, or any other surface which offers an advantage in thermal cooling, thus separating the heat generating packages away from the other components on motherboard 1112, such as set of computer components 1116. Connection lines 1110 can be a flexible interconnection fabric (such as a ribbon cable). The flexibility in the interconnection fabric helps avoid stresses involved due to dissimilar coefficients of thermal expansions. The flexible interconnection sceheme would allow the use of a different interconnection scheme than the use of specialized circuit boards, which, as described below, might not handle the difference in thermal expansion between subsystems.

As shown in FIG. 8, first VLSI chip package 1102 and second VLSI chip package 1104 are mounted to back surface 1106 for the heat dissipation benefits that the larger surface area which back surface 1106 provides. This heat dissipation property is further be enhanced by the provision of a set of heat dissipation devices 1130. In the preferred embodiment, set of heat dissipation devices 1130 are heat sinks made up of metal or some other thermally conductive material with a shape condusive to thermal exchange between the heat dissipation device and the ambient environment. Thus, in FIG. 8, set of heat dissipation devices 1130 are in the shape of fins. Also, fans can be used to further increase the airflow around set of heat dissipation devices 1130 and dissipate the generated heat.

To ensure that first VLSI chip package 1102 and second VLSI chip package 1104 are thermally integrated with back surface 1106 to the maximum extent, a set of thermally conductive contact patches 1132 are placed between first VLSI chip package 1102 and back surface 1106, and second VLSI chip package 1104 and back surface 1106. In a preferred embodiment, set of thermally conductive contact patches 1132 are thermally conductive adhesives or gels that is able to be in physical contact with a majority of the surface area of the packages and thereby as fully thermally couple the packages to back surface 1106 as possible.

When the chip packages heat up, back surface 1106 expands in horizontal directions 1118, possibly moving first VLSI chip package 1102 and second VLSI chip package 1104 away from each other. If the interconnect cable between first processor 1120 and second processor 1122 were not flexible, the movement of the chips in horizontal direction 1124 could be different than the distance of movement and direction 1118 of back surface 1106. This could cause damage in connection lines 1110, interrupting communication between first VLSI chip package 1102 and second VLSI chip package 1104. For this reason, flexible connection lines 1110 are preferred over having first VLSI chip package 1102 and second VLSI chip package 1104 both mounted on one printed circuit board.

Continuing to refer to FIG. 8, on the end of each cable of the flexible connection lines 1110 is a set of connectors 1114 for connecting to a set of pins on first VLSI chip package 1102 and second VLSI chip package 1104 (not shown). Thus, each cable can be interchangeable and do not have to be unique. Set of connecters 1114 can be of the kind used in circuit board interconnection technology.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention.

What is claimed is:

1. A system comprising:
 a chassis 1108 having a first circuit board 1112 mounted thereon, said first circuit board 1112 having a set of components 1116;
 an integrated circuit package 1102 mounted on a back surface 1106 of said chassis 1108;
 a set of flexible electrical connections 1110 establishing a communications network 1100 using a point-to-point network bus protocol between said first circuit board 1112 and said integrated circuit package 1102, said first circuit board 1112 and said integrated circuit package 1102 also include a network signal driver and a receiver to send and receive, respectively, signals for said point-to-point network bus protocol;
 where said integrated circuit package 1102 is thermally coupled to said back surface 1106 of said chassis 1108.

2. A system according to claim 1, where said chassis 1108 is constructed with a thermally conductive material.

3. A system according to claim 1, further comprising a heat dissipation device coupled to said integrated circuit package 1120.

4. A system according to claim 3, where said heat dissipation device is a heat sink 1130.

5. A system according to claim 3, where said heat dissipation device is a fan.

6. A system according to claim 1, further comprising a thermally conductive material 1132 disposed between said integrated circuit package 1102 and said back surface 1106 of said chassis 1108.

7. A system according to claim 6, where said thermally conductive material 1132 is a thermally conductive gel.

8. A system according to claim 1, where said integrated circuit package 1102 is a microprocessor.

9. A system according to claim 1, where said set of flexible electrical connections 1110 comprises:

a first connector 1114 coupled to said integrated circuit package 1102;

a second connector 1114 coupled to said set of components 1116; and, a first ribbon cable 1110 coupled to said first connector 1114 and said second connector 1114 to provide a first data path between said first connector 1114 and said second connector 1114.

10. A system according to claim 9, where said set of flexible electrical connections 1110 further comprises:

a third connector 1114 coupled to said integrated circuit package 1102;

a fourth connector 1114 coupled to said set of components 1116; and, a second ribbon cable 1110 coupled to said third connector 1114 and said fourth connector 1114 to provide a second data path between said third connector 1114 and said fourth connector 1114.

* * * * *